(12) United States Patent
Yamashita et al.

(10) Patent No.: US 10,396,000 B2
(45) Date of Patent: *Aug. 27, 2019

(54) TEST STRUCTURE MACRO FOR MONITORING DIMENSIONS OF DEEP TRENCH ISOLATION REGIONS AND LOCAL TRENCH ISOLATION REGIONS

(71) Applicants: International Business Machines Corporation, Armonk, NY (US); Globalfoundries, Inc., Grand Cayman (KY)

(72) Inventors: Tenko Yamashita, Schenectady, NY (US); Chun-Chen Yeh, Clifton Park, NY (US); Hui Zang, Guilderland, NY (US)

(73) Assignees: INTERNATIONAL BUSINESS MACHINES CORPORATION, Armonk, NY (US); GLOBALFOUNDRIES, INC. (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/789,476

(22) Filed: Jul. 1, 2015

(65) Prior Publication Data

US 2017/0005014 A1 Jan. 5, 2017

(51) Int. Cl.
*H01L 21/66* (2006.01)
*H01L 29/66* (2006.01)
(Continued)

(52) U.S. Cl.
CPC ...... *H01L 22/32* (2013.01); *H01L 21/823431* (2013.01); *H01L 22/12* (2013.01);
(Continued)

(58) Field of Classification Search
CPC ... H01L 22/12; H01L 21/76895; H01L 22/32; H01L 23/5222; H01L 23/5226; H01L 23/528
(Continued)

(56) References Cited

U.S. PATENT DOCUMENTS 6,677,242 B1   1/2004   Liu et al.
6,734,028 B1   5/2004   Yang et al.
(Continued)

OTHER PUBLICATIONS

List of IBM Patents or Patent Applications Treated as Related; Date Filed: Jul. 1, 2015, pp. 1-2.
(Continued)

*Primary Examiner* — Ori Nadav
(74) *Attorney, Agent, or Firm* — Cantor Colburn LLP; Vazken Alexanian

(57) ABSTRACT

Embodiments are directed to a method Embodiments are directed to a test structure of a fin-type field effect transistor (FinFET). The test structure includes a first conducting layer electrically coupled to a dummy gate of the FinFET, and a second conducting layer electrically coupled to a substrate of the FinFET. The test structure further includes a third conducting layer electrically coupled to the dummy gate of the FinFET, and a first region of the FinFET at least partially bound by the first conducting layer and the second conducting layer. The test structure further includes a second region of the FinFET at least partially bound by the second conducting layer and the third conducting layer, wherein the first region comprises a first dielectric having a first dimension, and wherein the second region comprises a second dielectric having a second dimension greater than the first dimension.

6 Claims, 10 Drawing Sheets

(51) Int. Cl.
 H01L 21/8234 (2006.01)
 H01L 27/088 (2006.01)
(52) U.S. Cl.
 CPC .............. *H01L 22/14* (2013.01); *H01L 22/20* (2013.01); *H01L 22/34* (2013.01); *H01L 27/0886* (2013.01); *H01L 29/66545* (2013.01)
(58) Field of Classification Search
 USPC .......................................................... 257/48
 See application file for complete search history.

(56) References Cited

U.S. PATENT DOCUMENTS

| | | | |
|---|---|---|---|
| 6,859,748 B1 | 2/2005 | Yang et al. | |
| 6,891,216 B1 | 5/2005 | Huang et al. | |
| 7,002,177 B2 | 2/2006 | Chang et al. | |
| 7,679,083 B2* | 3/2010 | Sun | H01L 22/32 257/48 |
| 7,772,868 B2 | 8/2010 | Doong et al. | |
| 8,330,111 B2* | 12/2012 | Ojefors | H01L 23/66 250/341.1 |
| 9,159,633 B2 | 10/2015 | Yamashita et al. | |
| 9,508,764 B2* | 11/2016 | Boppel | H01L 31/101 |
| 9,941,179 B2* | 4/2018 | Logan | H01L 22/14 |
| 2004/0152220 A1* | 8/2004 | Kang | H01L 22/34 438/14 |
| 2008/0237586 A1* | 10/2008 | Sun | H01L 22/32 257/48 |
| 2013/0140564 A1 | 6/2013 | Lutz | |
| 2013/0228778 A1* | 9/2013 | Tsai | G01B 7/082 257/48 |
| 2015/0076498 A1* | 3/2015 | Yamashita | H01L 22/10 257/48 |
| 2015/0162331 A1* | 6/2015 | Kang | H01L 22/34 257/48 |

OTHER PUBLICATIONS

Yamashita et al., "Test Structure Macro for Monitoring Dimensions of Deep Trench Isolation Regions and Local Trench Isolation Regions," U.S. Appl. No. 15/292,184, filed Oct. 13, 2016.

Doong et al., "4K-cells Resistive and Charge-Base-Capacitive Measurement Test Structure Array (R-CBCM-TSA) for CMOS Logic Process Development, Monitor and Model," IEEE International Conference on Microelectronic Test Structures, ICMTS 2009, pp. 2.

Gaddam et al., "An improved process, metrology and methodology for shallow trench isolation etch," IEEE Conference and Workshop Advanced Semiconductor Manufacturing, ASMC'04, 2004, pp. 93-97.

* cited by examiner

TEST STRUCTURE MACRO FOR MONITORING DIMENSIONS OF DEEP TRENCH ISOLATION REGIONS AND LOCAL TRENCH ISOLATION REGIONS

BACKGROUND

The present disclosure relates in general to semiconductor devices and their manufacture. More specifically, the present disclosure relates to the fabrication of a test structure macro to monitor dimensions (e.g., a depth) of deep trench isolation regions and local/shallow trench isolation regions.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

One particularly advantageous type of MOSFET is known generally as a fin-type field effect transistor (FinFET). FIG. 1 depicts a three-dimensional view of an exemplary FinFET 100, which includes a "local" shallow trench isolation (STI) region 104 and a "deep" STI region 120 for isolation of active areas from one another. The basic electrical layout and mode of operation of FinFET 100 do not differ significantly from a traditional field effect transistor. FinFET 100 includes a semiconductor substrate 102, local STI region 104, deep STI region 120, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on local STI region 104 and substrate 102. Substrate 102 may be silicon, and local STI region 104 and deep STI region 120 may be an oxide (e.g., $SiO_2$). Fin 106 may be silicon that has been enriched to a desired concentration level of germanium. Gate 114 controls the source to drain current flow (labeled ELECTRICITY FLOW in FIG. 1). In contrast to a planar MOSFET, however, source 108, drain 110 and channel 112 are built as a three-dimensional bar on top of local STI region 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The source and drain regions may be suitably doped to produce the desired FET polarity, as is known in the art. The dimensions of the fin establish the effective channel length for the transistor.

It is a challenge in FinFET manufacturing processes to form fins with uniform heights and widths. An "effective" dimension of a FinFET is usually different from the dimension that is selected during the device layout stage. This is because different fabrication processes inevitably results in some dimension offset during the manufacturing process. For example, current 10 nanometer FinFET devices employ both local STI regions and deep STI regions to isolate fins. Fabrication of local STI regions and deep STI regions in a FinFET include two-step oxide fills, oxide CMP (chemical mechanical polishing/planarization), oxide and nitride depositions as protection layers in the FIN regions during deep STI etching and CMP, $HPO_4$ acid wet etch for nitride removal, and the like. The fin adjacent the deep STI region is known generally as the "last fin" and is highly susceptible to channel loss from local and deep STI region fabrication techniques. Material loss in the fin channel region degrades fin/device performance (e.g., high leakage currents, lower drive current, etc.) and can render multi-fin devices unsuitable for applications such as SRAM.

SUMMARY

Embodiments are directed to a test structure of a fin-type field effect transistor (FinFET). The test structure includes a first conducting layer electrically coupled to a dummy gate of the FinFET, and a second conducting layer electrically coupled to a substrate of the FinFET. The test structure further includes a third conducting layer electrically coupled to the dummy gate of the FinFET, and a first region of the FinFET at least partially bound by the first conducting layer and the second conducting layer. The test structure further includes a second region of the FinFET at least partially bound by the second conducting layer and the third conducting layer, wherein the first region comprises a first dielectric having a first dimension, and wherein the second region comprises a second dielectric having a second dimension greater than the first dimension.

Embodiments are further directed to a method of forming a test structure of a FinFET. The method includes forming a first conducting layer and electrically coupling the first conducting layer to a dummy gate of the FinFET. The method further includes forming a second conducting layer and electrically coupling the second conducing layer to a substrate of the FinFET. The method further includes forming a third conducting layer and electrically coupling the third conducting layer to the dummy gate of the FinFET, wherein the formation of the first conducing layer and the second conducting layer define boundaries of a first region of the FinFET, and wherein the formation of the second conducting layer and the third conducting layer define boundaries of a second region of the FinFET.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1:
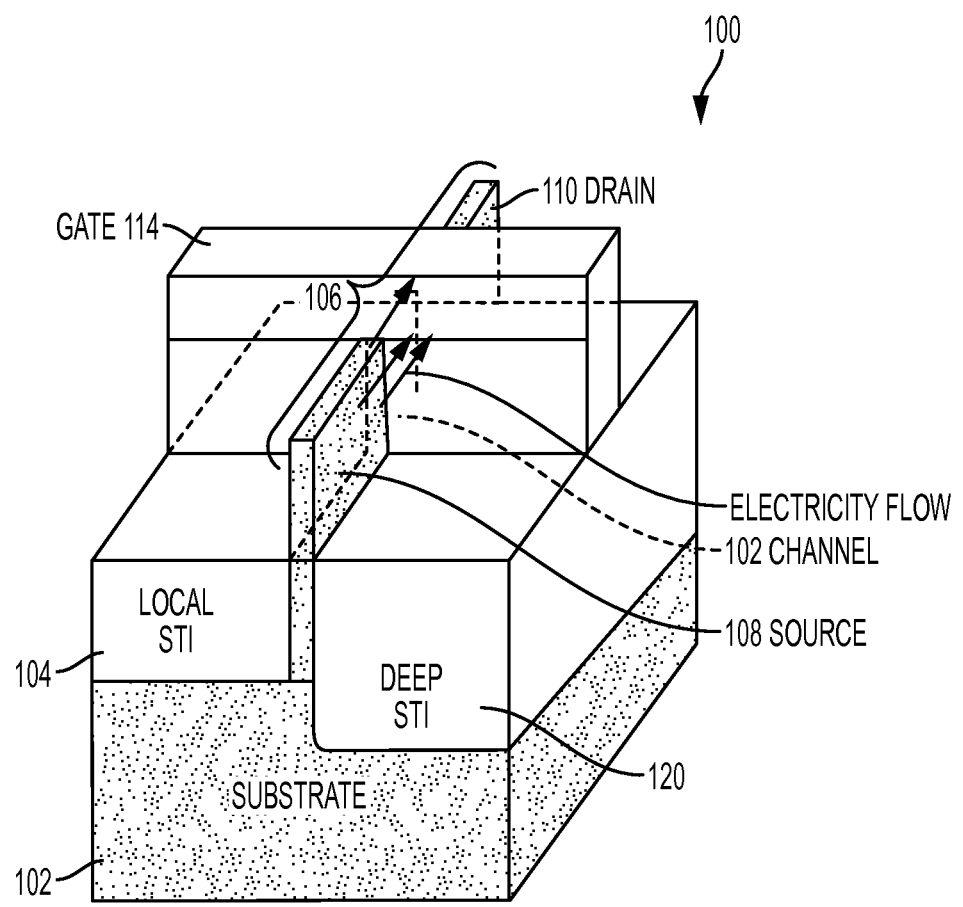
FIG. 1 depicts a three-dimensional view of an exemplary configuration of a known FinFET device.

It is understood in advance that although this disclosure includes a detailed description of an exemplary FinFET configuration, implementation of the teachings recited herein are not limited to the particular FinFET structure disclosed herein. Rather, embodiments of the present disclosure are capable of being implemented in conjunction with any other type of fin-based transistor device now known or later developed.

As previously noted herein, it is a challenge in FinFET manufacturing processes to form fins with uniform heights and widths. An "effective" dimension of a FinFET is usually different from the dimension that is selected during the device layout stage. This is because different fabrication processes inevitably results in some dimension offset during the manufacturing process. For example, current 10 nanometer FinFET devices employ both local STI regions and deep STI regions to isolate fins. Fabrication of local STI regions and deep STI regions in a FinFET include two-step oxide fills, oxide CMP (chemical mechanical polishing/planarization), oxide and nitride depositions as protection layers in the FIN regions during deep STI etching and CMP, $HPO_4$ acid wet etch for nitride removal, and the like. The fin adjacent the deep STI region is known generally as the "last fin" and is highly susceptible to channel loss from the local and deep STI region fabrication techniques. Material loss in the fin channel region degrades fin performance and can render multi-fin devices unsuitable for applications such as SRAM (static random access memory).

The present disclosure provides a test structure or macro that may be attached to and fabricated with an integrated circuit having various lower electrical devices, such as transistors. The disclosed test structure monitors the leveling of deep trench isolation regions and shallow trench isolation regions of the lower level of FinFET semiconductor devices. The test structure includes a configuration of metal pads that are connected to the gate and substrate of the semiconductor device at various locations for measuring the capacitance in different regions of the semiconductor device. In regions of the semiconductor device where the fin is present, the first capacitance (Cap1) measured through the metal pads between the gate and the substrate will be proportional to the local STI region thickness. In regions of the device where the fin is not present, the capacitance (Cap2) measured through the metal pads between the gate and the substrate will be proportional to the deep STI region thickness. The Cap1 can then be compared to Cap2 to determine whether the STI depths of the fabricated device are within device design specifications. For example, if the device design specification calls for the depth of the deep STI region to be twice the depth of the local STI region, Cap1 should be two times Cap2. If the relationship between the measured capacitances does not align with what is expected based on the design specifications, corrective fabrication techniques may be applied to correct the problem before the device fabrication is finalized.

Figure 2:
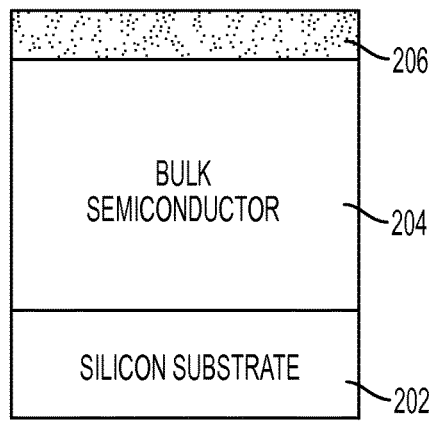
FIG. 2 depicts a semiconductor substrate, a bulk semiconductor material and a hard mask layer after an initial fabrication stage according to one or more embodiments.
Figure 3:
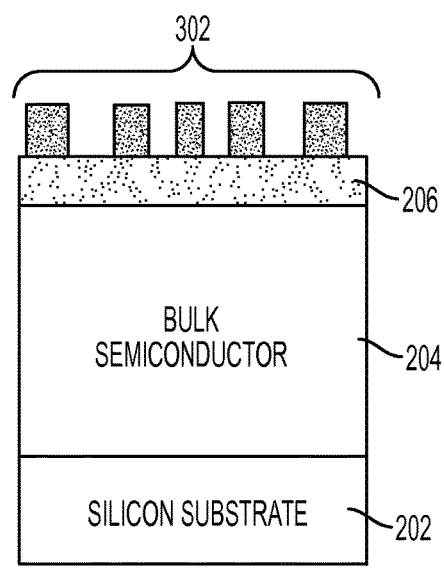
FIG. 3 depicts a cross sectional view of a semiconductor device after an intermediate fabrication stage according to one or more embodiments.
Figure 4:
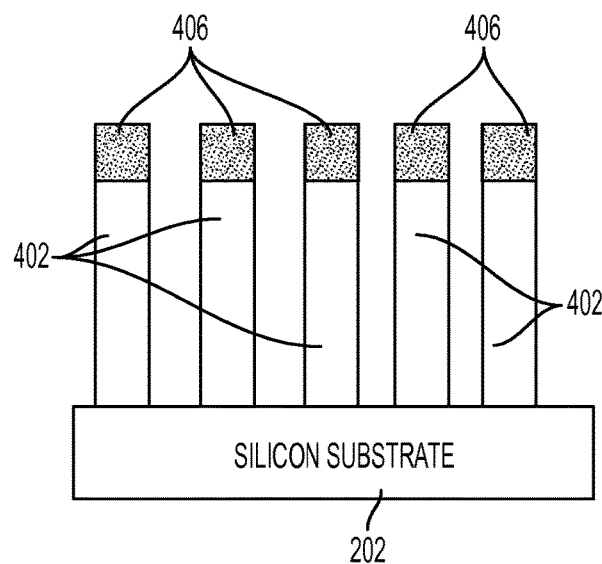
FIG. 4 depicts a cross sectional view of a semiconductor device after an intermediate fabrication stage according to one or more embodiments.

A fabrication methodology for forming selected stages of a FinFET semiconductor device having a test structure in accordance with one or more embodiments of the present disclosure will now be described with reference to FIGS. 2-17. Referring now to FIG. 2, an initial structure is formed having semiconductor substrate 202, a bulk semiconductor material 204 and a hard mask layer 206, configured and arranged as shown. It is noted that bulk semiconductor material 204 and semiconductor substrate 202 may be substantially the same material. Hard mask layer 206 may be a silicon nitride material (e.g., $Si_3N_4$). In FIG. 3, a patterned resist 302 is added over hard mask layer 206 to pattern and form fins 402 (shown in FIG. 4) from bulk semiconductor 204. Fins 402 may be formed by applying an anisotropic etch process, which results in the structure shown in FIG. 4. Because there is no stop layer on semiconductor substrate 202, the etch process is time based.

Figure 5:
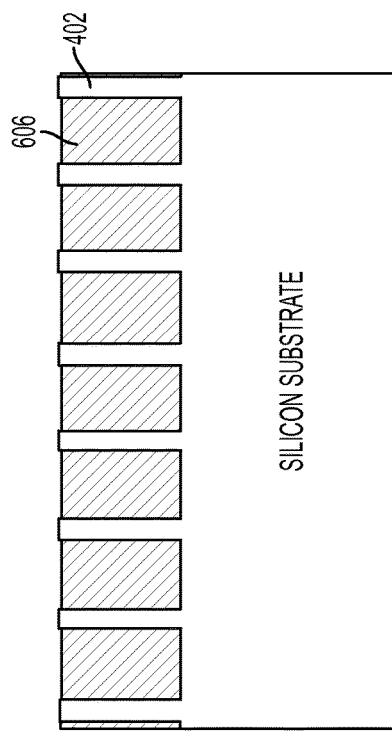
FIG. 5 depicts a cross sectional view of a semiconductor device after an intermediate fabrication stage according to one or more embodiments.

In FIG. 5, a local oxide (e.g., $SiO_2$) is deposited between fins 402 and over substrate 202. For ease of illustration, only one fin is labeled with a reference number.

Figure 6:
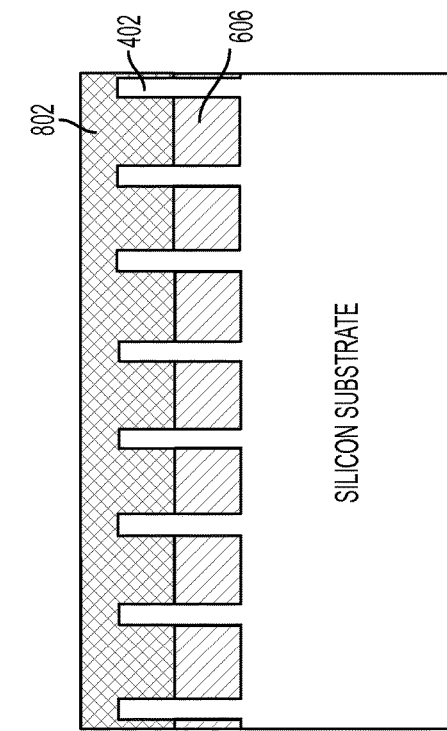
FIG. 6 depicts a cross sectional view of a semiconductor device after an intermediate fabrication stage according to one or more embodiments.
Figure 7:
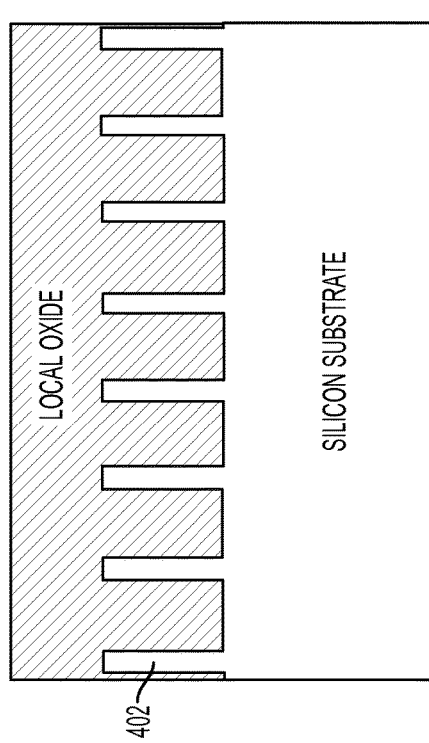
FIG. 7 depicts a cross sectional view of a semiconductor device after an intermediate fabrication stage according to one or more embodiments.
Figure 8:
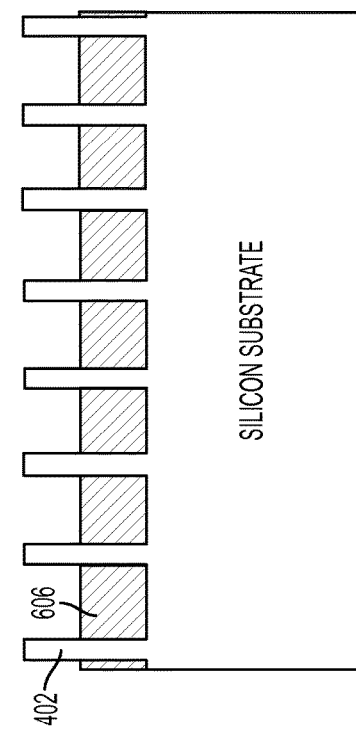
FIG. 8 depicts a cross sectional view of a semiconductor device after an intermediate fabrication stage according to one or more embodiments.
Figure 10:
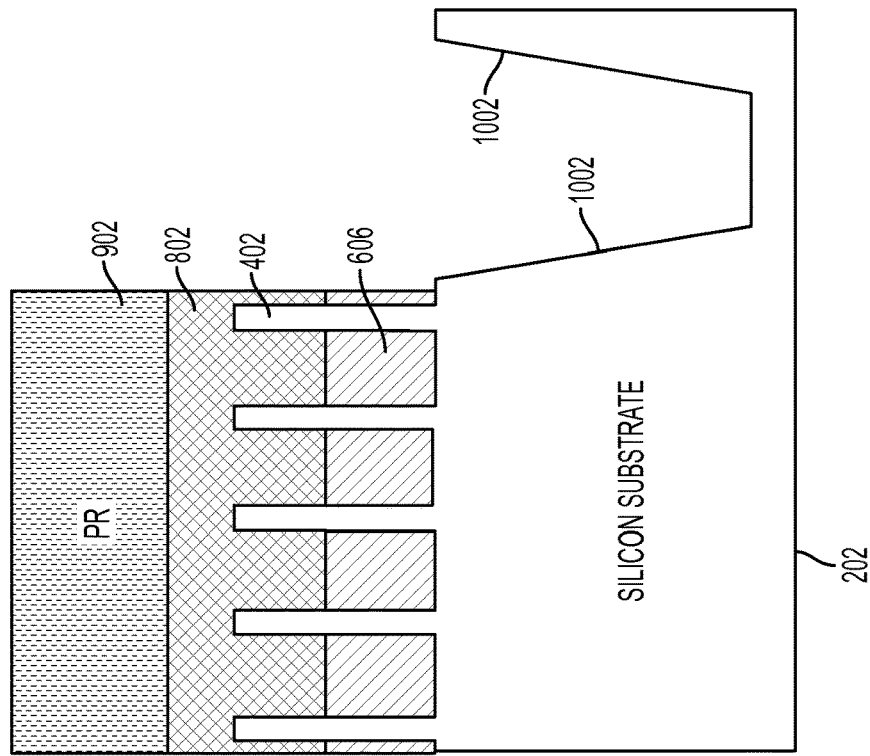
FIG. 10 depicts a cross sectional view of a semiconductor device after an intermediate fabrication stage according to one or more embodiments.
Figure 9:
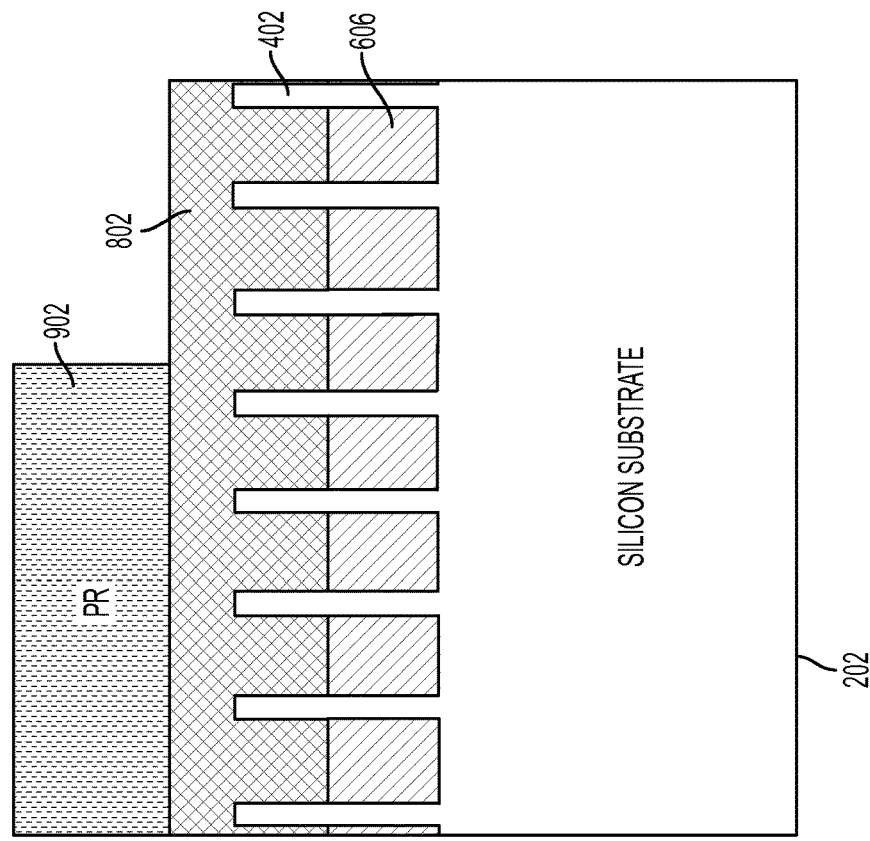
FIG. 9 depicts a cross sectional view of a semiconductor device after an intermediate fabrication stage according to one or more embodiments.
Figure 12:
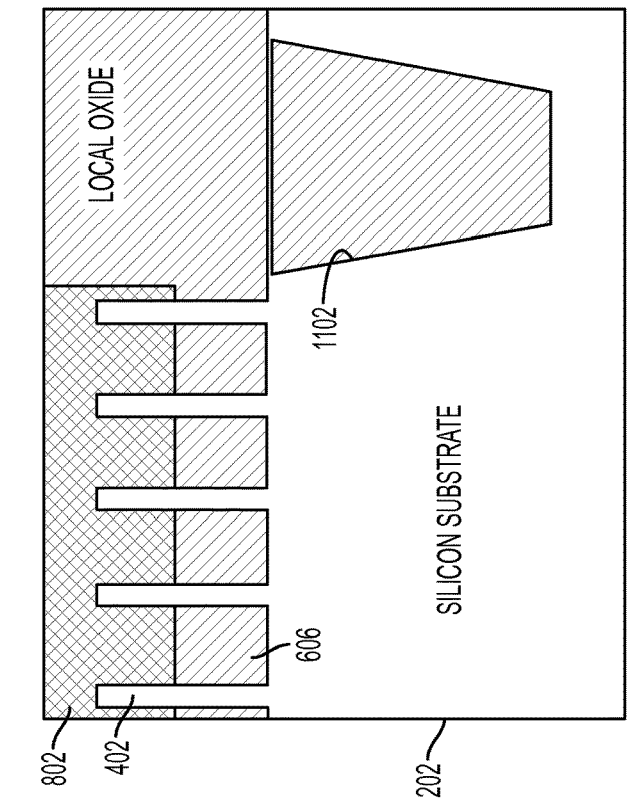
FIG. 12 depicts a cross sectional view of a semiconductor device after an intermediate fabrication stage according to one or more embodiments.
Figure 11:
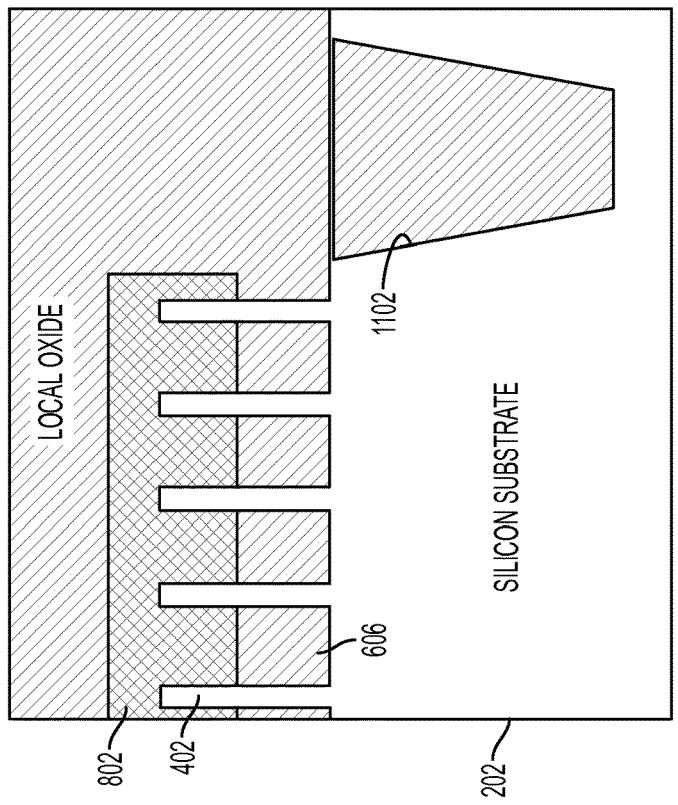
FIG. 11 depicts a cross sectional view of a semiconductor device after an intermediate fabrication stage according to one or more embodiments.

As shown in FIGS. 6 and 7, the local oxide is polished and recessed back to form local STI regions 606, and to expose upper portions of fins 402. Again, for ease of illustration, only one local STI region is labeled with a reference number. In FIG. 8, another SiN layer 802 is deposited over local STI regions 606 and exposed portions of fins 402. As shown in FIGS. 9 and 10, photoresist (PR) layer 902 is deposited to pattern the subsequent etching of unprotected portions of SiN layer 802, fins 402, local STI regions 606 and silicon substrate 202, to form a region 1002 that will subsequently be filled to form a deep STI region 1102 (shown in FIG. 11). As shown in FIGS. 11 and 12, photoresist 902 is removed, and additional local oxide (e.g., $SiO_2$) is deposited over SiN layer 802, filling in region 1002 (shown in FIG. 10) to form deep STI region 1102. In FIG. 12, the additional local oxide is polished down to the level of the SiN layer 802.

Figure 13:
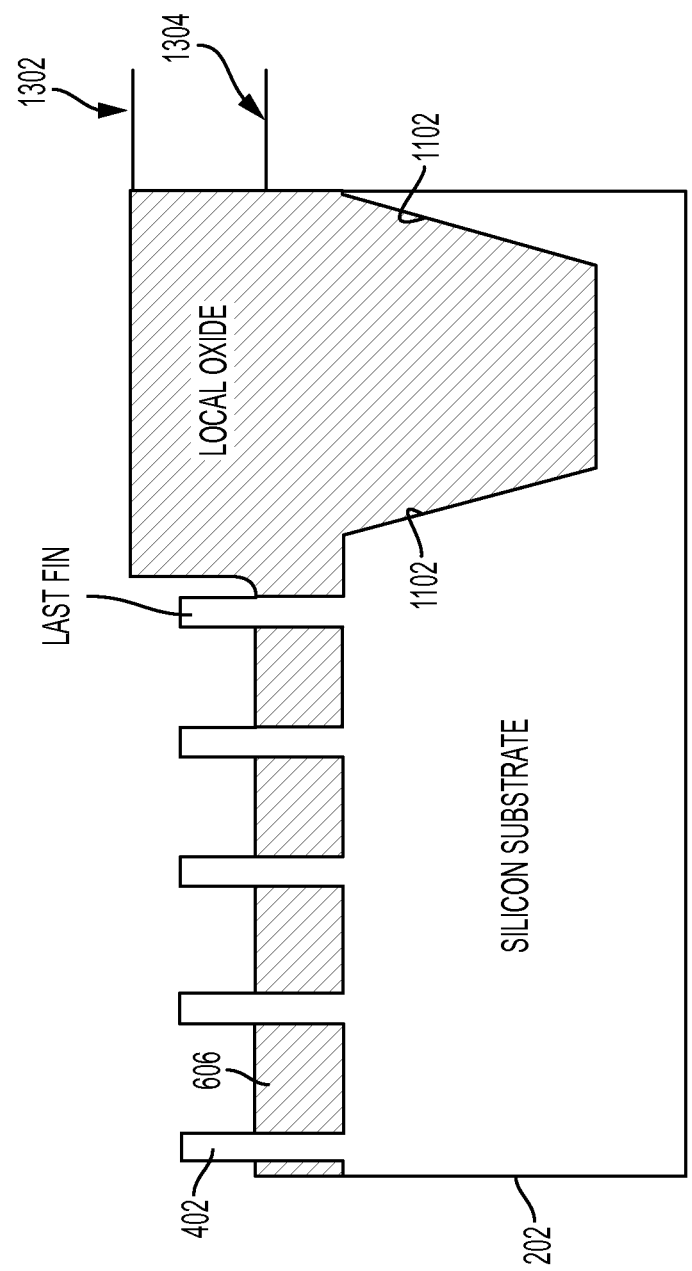
FIG. 13 depicts a cross sectional view of a semiconductor device after an intermediate fabrication stage according to one or more embodiments.

In FIG. 13, the SiN layer 802 has been selectively removed. This results in a level 1302 of local oxide/deep STI region 1102 being higher than a level 1304 of local STI region 606, which, because of variability in actual device fabrication steps, can cause variability in the actual height of the "last fin." For example, the fabrication steps used to form local STI regions 606 and deep STI regions 1102, which included two-step oxide fills, oxide CMP, oxide and nitride depositions as protection layers, deep STI etching, $HPO_4$ acid wet etch for nitride removal, and the like can result in dimension variations that can degrade performance by causing channel loss in the "last fin." Material loss in the fin channel region degrades fin/device performance (e.g., high leakage currents, lower drive current, etc.) and can render multi-fin devices unsuitable for applications such as SRAM.

Figure 14:
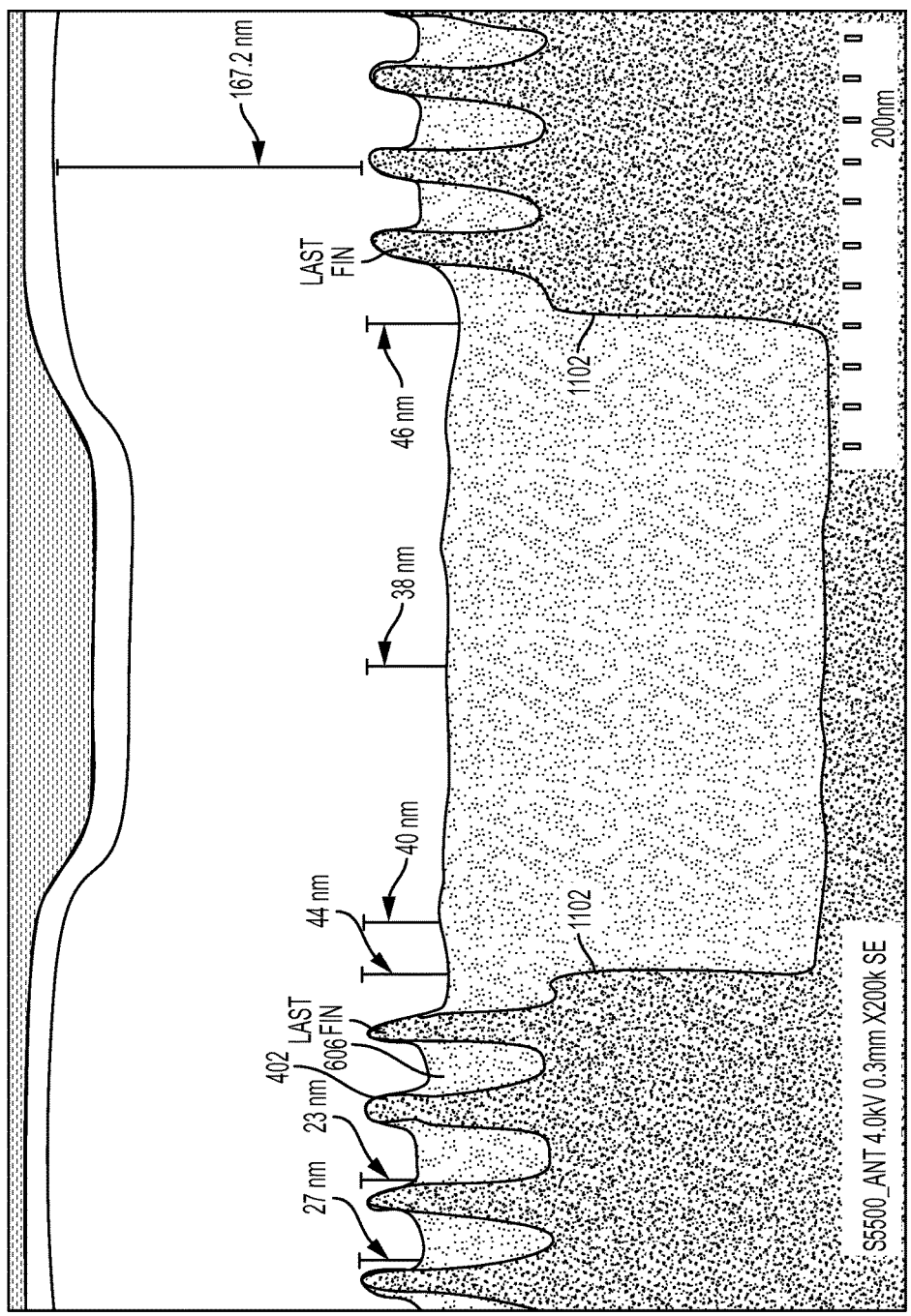
FIG. 14 depicts a diagram representing an electron microscope image of a semiconductor device after an intermediate stage of fabrication.

FIG. 14 depicts a diagram representing an electron microscope image of a FinFET, local and deep STI semiconductor device of the type shown in FIG. 13 after an application of a deep STI recess process to recess the local oxide shown in FIG. 13 such that a level of deep STI region 1102 is intended to be substantially equal to a level of local STI region 606. However, local STI regions 606 and deep STI region 1102 will still demonstrate considerable fin height variability as shown by the different fin heights labeled throughout the device shown in FIG. 14.

Additional known fabrication operations are applied to the structure shown in FIG. 14, including forming a dummy gate/PC (not shown) over exposed upper portions of fins 402. The acronym "PC" as used herein is synonymous with the phrase "dummy gate." Offset spacers (not shown) are formed along the sidewalls of the dummy gate/PC. In a gate-last fabrication process, dummy gate/PC may be removed and replaced with a metal gate (not shown) according to a known replacement gate last (RMG) fabrication process.

Figure 15:
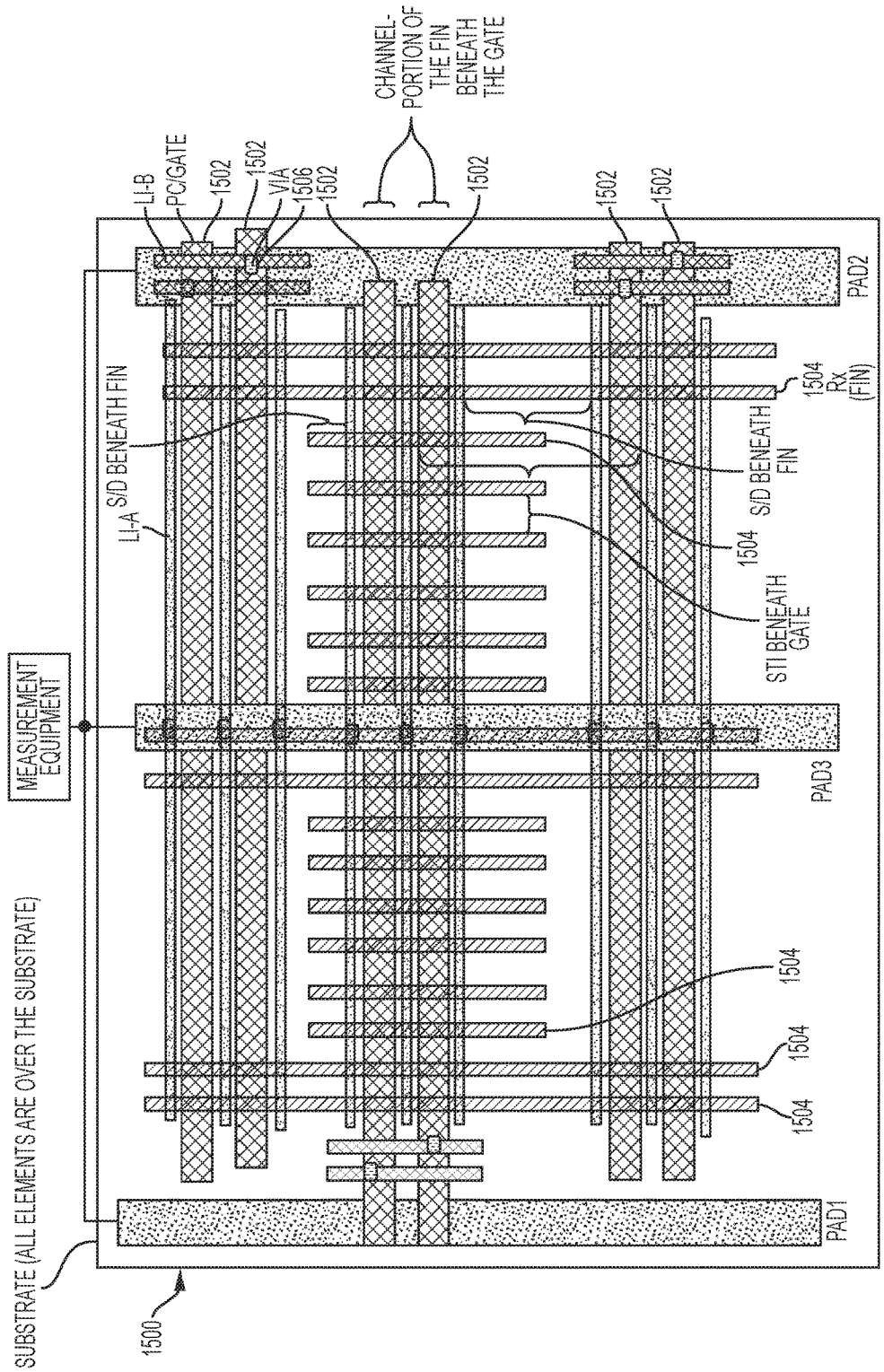
FIG. 15 depicts a test structure according to one or more embodiments of the present disclosure.

FIG. 15 depicts a two dimensional top view of an integrated circuit having a test structure/macro 1500 according to one or more embodiments of the present disclosure. For ease of illustration, where the same element is shown in multiple locations on the diagram, only selected ones of the same element are provided with a reference number. The integrated circuit includes a plurality of FinFET devices having gate/PC regions 1502, fin/Rx regions 1504 formed on a substrate. Gates/PC regions 1502 extend horizontally from left to right or from right to left. Fin/Rx regions 1504 extend vertically from top to bottom or from bottom to top. An individual fin/Rx region may represent a channel region, a source region or a drain region of the FinFET depending on whether gate/PC region 1502 is over fin/Rx region 1504. The areas in which gate/PC regions 1502 are present and are over fin/Rx regions 1504 are the channel regions of the fin/Rx, which is an "active" region of the FinFET device, wherein STI is not present. The areas of fin/Rx regions 1504 in which gate/PC is not present are the source and drain regions of fin/Rx regions 1504. The areas in which gate/PC region 1502 is present and not over fin/Rx region 1504 is an "inactive" region of the FinFET device, wherein STI is present.

Test structure/macro 1500 includes a plurality of metal layers depicted in FIG. 15 as Pad 1, Pad2 and Pad3. Local interconnects (LI-A) and vias 1506 electrically couple the source and drain regions of fin/Rx regions 1504. Local interconnects (LI-B) and vias 1506 electrically couple the metal layers (Pad1, Pad2, Pad3) to gate/PC regions 1502. In operation, measurement equipment (e.g., a C-V instrument) may be connected to test structure 1500 to take various capacitance measurements from the metal layers (Pad1, Pad2, Pad3) through local interconnects (LI-B), gate/PC regions 1502 and the substrate. More specifically, selected capacitance measurements between Pad1, Pad2 and/or Pad 3 correspond to the presence of inactive regions in which STI is present. Additionally, the magnitude of selected capacitance measurements between Pad1, Pad2 and Pad3, correspond to and may be used to identify whether an inactive region in which STI is present is a "local" STI region or a "deep" STI region. Further, the magnitude of selected capacitance measurements between Pad1, Pad2 and Pad3 correspond to and may be used to identify dimensions (e.g., a depth) of the "local" STI regions and the "deep" STI regions, and these measurements may be compared to each other and to design specification targets. Based on the relationship between the measured/calculated depths, local STI may be distinguished from deep STI. For example, according to design specifications, the deep STI depths should be double the local STI depths. If the measured/calculated depths vary sufficiently from the design specification targets, the variation may be detected during a stage of FinFET fabrication in which corrective measures may be taken.

An example of capacitance measurements that may be taken from the metal layers (Pad1, Pad2, Pad3) of test structure/macro 1500 is as follows. Cap1 is a measurement of the capacitance between Pad1 and Pad3, which measures the capacitance between the substrate and the two gate/PC regions 1502 shown in the middle of the FIG. 15 diagram between Pad1 and Pad3. The measured Cap1 will be due to the inactive regions (i.e., regions in which gate/PC region 1502 is present but fin/Rx region 1504 is not present) between Pad1 and Pad3. Similarly, Cap2 is a measurement of the capacitance between Pad3 and Pad2, which measures the capacitance between the substrate and the two gate/PC regions 1502 shown at the top of the FIG. 15 diagram, along with the capacitance between the substrate and the two gate/PC regions 1502 shown at the bottom of the FIG. 15 diagram. The measured Cap1 and Cap2 will be due to the inactive regions (i.e., regions in which gate/PC region 1502 is present but fin/Rx region 1504 is not present). A visual inspection of the FIG. 15 diagram shows that the inactive regions identified by Cap1 should be local STI, and the inactive regions identified by Cap2 should be deep STI. Accordingly, a comparison between a magnitude of Cap1 and a magnitude of Cap2 should identify information about the corresponding inactive regions, including but not limited to whether Cap1 is local or deep STI, whether Cap2 is local or deep STI, and whether the actual dimensions (e.g., depth, level, etc.) of Cap1 is less than Cap2 by a predetermined amount.

Figure 16:
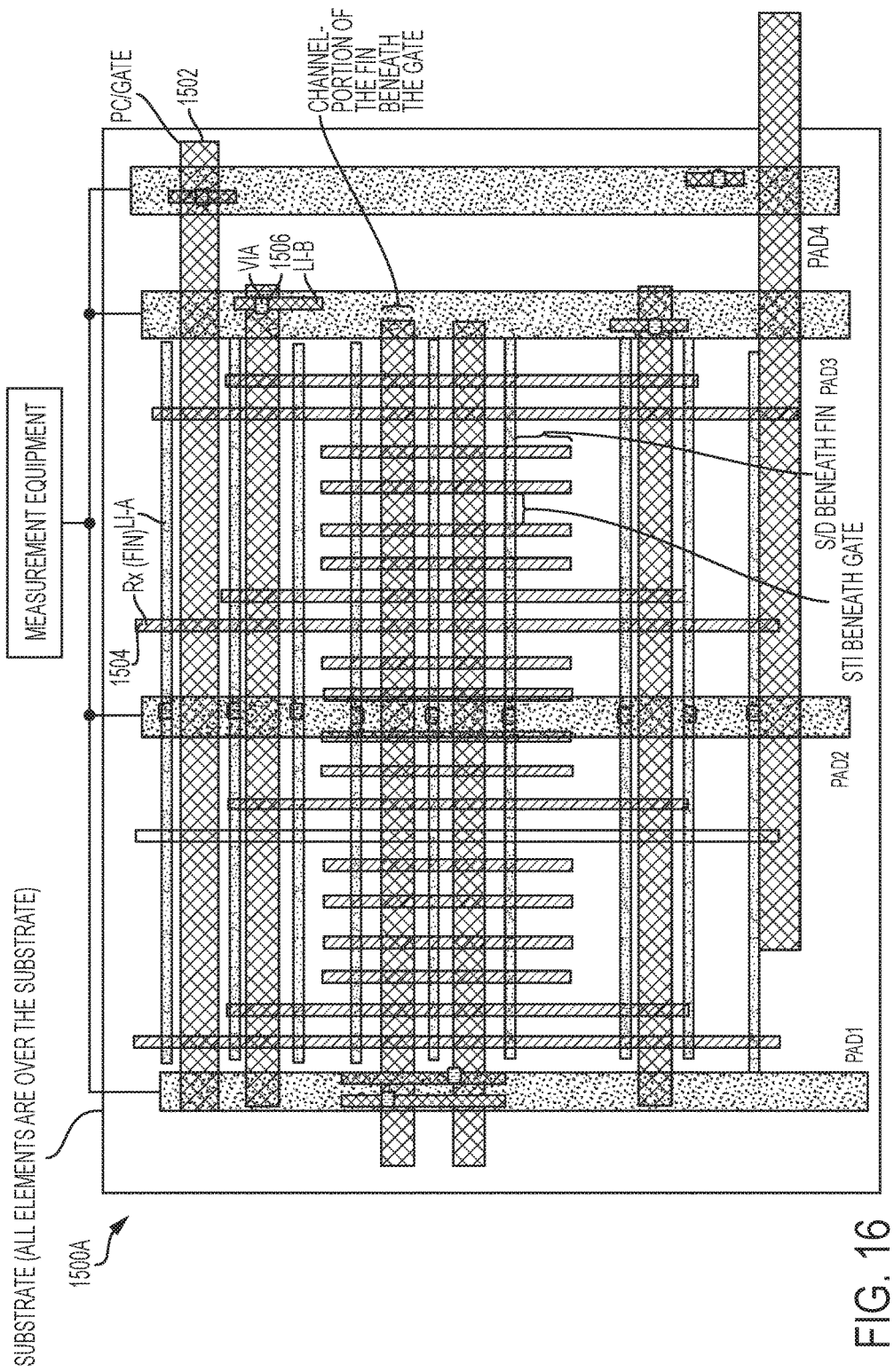
FIG. 16 depicts another test structure according to one or more embodiments of the present disclosure.

FIG. 16 depicts a two dimensional top view of an integrated circuit having a test structure/macro 1500A according to one or more embodiments of the present disclosure. Test structure/macro 1500A is substantially the same as test structure/macro 1500 shown in FIG. 15, except an additional metal layer Pad4 is provided and configured as shown in order to accommodate an alternative FinFET layout referred to herein as a "2 Fin" design. For test structure/macro 1500A, Cap1 is a measurement of the capacitance between Pad1 and Pad2, which measures the capacitance between the substrate and the two gate/PC regions 1502 shown in the middle of the FIG. 16 diagram between Pad1 and Pad2. The measured Cap1 will be due to the inactive regions (i.e., regions in which gate/PC region 1502 is present but fin/Rx region 1504 is not present) between Pad1 and Pad2. Similarly, Cap2 is a measurement of the capacitance between Pad2 and Pad3, as well as a measurement of the capacitance between Pad2 and Pad4, which measures the capacitance between the substrate and the two gate/PC regions 1502 shown at the top of the FIG. 16 diagram, along with the capacitance between the substrate and the two gate/PC regions 1502 shown at the bottom of the FIG. 16 diagram. More specifically, the capacitance between the substrate and gate/PC regions 1502 having two fin/Rx regions 1504 is measured by the capacitance between Pad2 and Pad4, and the capacitance between the substrate and gate/PC regions 1504 having four fin/Rx regions 1504 is measured by the capacitance between Pad 2 and Pad3. The measured Cap1 and Cap2 will be due to the inactive regions (i.e., regions in which gate/PC region 1502 is present but fin/Rx region 1504 is not present). A visual inspection of the FIG. 16 diagram shows that the inactive regions identified by Cap 1 should be local STI, and the inactive regions identified by Cap2 should be deep STI. Additionally, non-uniformity of the STI thickness may be introduced in gate/PC regions in which the fin/Rx regions are spaced far apart as shown by gate/PC regions 1502 shown at the extreme top and bottom of the FIG. 16 diagram. Accordingly, a comparison between the capacitance between Pad2 and Pad4 and the capacitance between Pad2 and Pad3 will reveal non-uniformity of the STI thickness between Pad2 and Pad4. Additionally, a comparison between a magnitude of Cap1 and a magnitude of Cap2 should identify information about the corresponding inactive regions, including but not limited to whether Cap1 is local or deep STI, whether Cap2 is local or deep STI, and whether the actual dimensions (e.g., depth, level, etc.) of Cap1 is less than Cap2 by a predetermined amount. The test structure configuration 1500A shown in FIG. 16 is one example of how the disclosed test structure may be extended to FinFET designs having gate/PC regions with different spacing between the stand alone fin/Rx regions, as well as different numbers of fin/Rx regions. With additional Pads, additional configurations may be accommodated.

Figure 17:
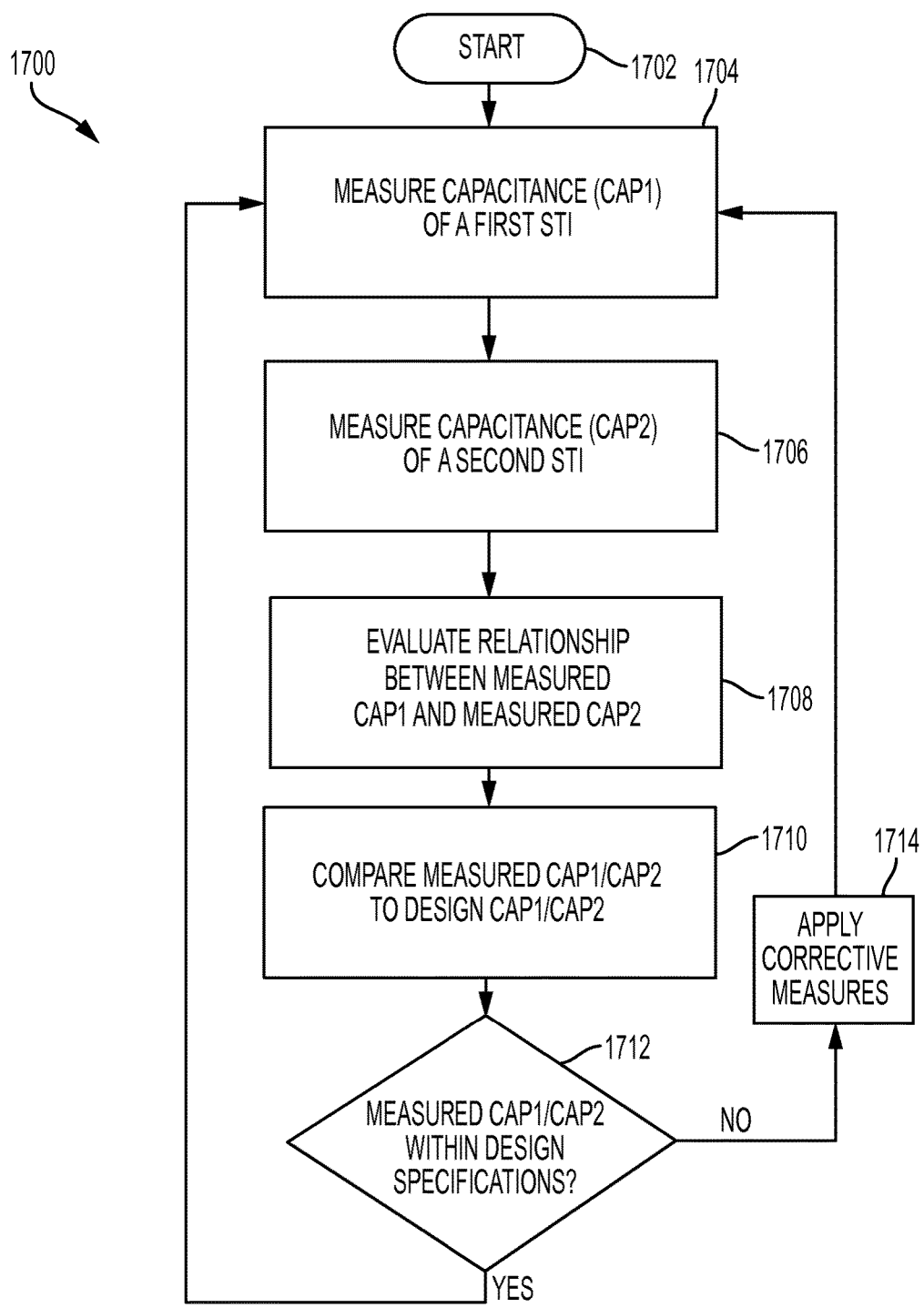
FIG. 17 is a flow diagram illustrating a methodology according to one or more embodiments.

FIG. 17 is a flow diagram illustrating a methodology 1700 according to one or more embodiments. Methodology 1700 starts at block 1702 and at block 1704 measures capacitance of a first STI. The measurement is "blind" in that it is not known before the measurement whether the first STI is a local STI or a deep STI. Block 1706 measures a capacitance of a second STI. Similarly, it is not known before the measurement whether the second STI is a local STI or a deep STI. Block 1708 evaluates the relationship between the measured capacitance of first STI and the measured capacitance of second STI. The relationship between the measured capacitance of the first STI and the second STI can determine whether the first STI is a local or deep STI, and whether the second STI is a local or deep STI. Once the first STI is categorized as either a local STI or a deep STI, and the second STI is categorized as either a local STI or a deep STI, block 1710 compares the magnitude of the measured capacitances. Decision block 1712 determines whether the measured capacitances are within an acceptable range of the design specifications. If the answer to the inquiry at decision block 1712 is no, methodology 1700 returns to block 1704 to measure the next capacitance. If the answer to the inquiry at decision block 1712 is no, methodology 1700 applies corrective measures at block 1714 then returns to block 1704 to measure the next capacitance.

Thus, it can be seen from the forgoing detailed description and accompanying illustrations that embodiments of the present disclosure provide test structures/macros and methodologies for determining dimensions of local STI regions and deep STI regions. The present disclosure provides a test structure/macro that may be attached to and fabricated with an integrated circuit having various lower electrical devices, such as transistors. The disclosed test structure monitors dimensions (e.g., a depth) of deep trench isolation regions and shallow trench isolation regions of the lower level of FinFET semiconductor devices. The test structure includes a configuration of metal pads that are connected to the gate and substrate of the semiconductor device at various locations for measuring the capacitance in different regions of the semiconductor device. In regions of the semiconductor device underneath a dummy gate/PC region where the fins are not present, the first capacitance (Cap1) measured through certain metal pads between the gate and the substrate will be proportional to a first STI region thickness, and the second capacitance (Cap2) measured through the metal pads between the gate and the substrate will be proportional to a second STI region thickness. Cap1 can then be compared to Cap2 to determine whether the STI depths correspond to a local STI or a deep STI, and to determine whether the fabricated STI regions are within device design specifications. For example, if the device design specification calls for the depth of the deep STI region to be twice the depth of the local STI region, Cap1 should two times Cap2. If the relationship between the measured capacitances does not align with what is expected based on the design specifications, corrective fabrication techniques may be applied to correct the problem before the device fabrication is finalized.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a test structure of a fin-type field effect transistor (FinFET) formed in an active region of a substrate, the method comprising:
   forming a first conducting layer;
   electrically coupling the first conducting layer to a dummy gate of the FinFET;
   forming a second conducting layer;
   electrically coupling the second conducing layer to a first isolation region of the substrate, wherein the first isolation region electrically isolates the FinFET from other devices of the active region of the substrate;
   electrically coupling the second conductive layer to a second isolation region of the substrate, wherein the second isolation region electrically isolates the active region of the substrate from another active region of the substrate;
   forming a third conducting layer; and
   electrically coupling the third conducting layer to the dummy gate of the FinFET;
   wherein the formation of the first conducing layer and the second conducting layer define boundaries of the first isolation region of the substrate;
   wherein the formation of the second conducting layer and the third conducting layer define boundaries of the second isolation region of the substrate;
   measuring a first capacitance between the first conducting layer and the second conducting layer;
   measuring a second capacitance between the second conducting layer and the third conducting layer;
   classifying a type of the first isolation region as a local shallow trench isolation (STI) type or a deep STI type based on a magnitude of the first capacitance; and
   classifying a type of the second isolation region as a local STI type or a deep STI type based on a magnitude of the second capacitance;
   wherein the local STI type comprises a local STI type depth dimension;
   wherein the deep STI type comprise a deep STI type depth dimension;
   wherein the local STI type depth dimension is less than the deep STI type depth dimension.

2. The method of claim 1, wherein the electrical coupling of the first conducing layer to the dummy gate comprises a first local interconnect and a first via.

3. The method of claim 1, wherein the electrical coupling of the second conducting layer to the first isolation region of the substrate or the second isolation region of the substrate comprises a second local interconnect and a second via.

4. The method of claim 1, wherein the electrical coupling of the third conducting layer to the dummy gate comprise a third local interconnect and a third via.

5. The method of claim 1 further comprising determining that the local STI type depth dimension varies from a predetermined design target for the local STI type depth dimension.

6. The method of claim 5 further comprising determining that the deep STI type depth dimension varies from a predetermined design target for the deep STI type depth dimension.

* * * * *